United States Patent [19]

Ferris et al.

[11] Patent Number: 4,581,550

[45] Date of Patent: Apr. 8, 1986

[54] TTL TRISTATE DEVICE WITH REDUCED OUTPUT CAPACITANCE

[75] Inventors: David A. Ferris, West Buxton; Benny Chang, South Portland; Tim-Wah Luk, Scarborough, all of Me.

[73] Assignee: Fairchild Camera & Instrument Corporation, Cupertino, Calif.

[21] Appl. No.: 586,671

[22] Filed: Mar. 6, 1984

[51] Int. Cl.$^4$ ............... H03K 19/013; H03K 19/088; H03K 19/003

[52] U.S. Cl. ................... 307/473; 307/443; 307/456; 307/317 A

[58] Field of Search ............... 307/473, 456, 457, 458, 307/443, 299 A, 317 A

[56] References Cited

U.S. PATENT DOCUMENTS

| | | | |
|---|---|---|---|
| 3,394,268 | 7/1968 | Murphy | 307/457 |
| 3,808,457 | 4/1974 | Filippov et al. | 307/457 X |
| 4,151,609 | 4/1979 | Moss | 307/458 X |
| 4,255,670 | 3/1981 | Griffith | 307/473 |
| 4,311,927 | 1/1982 | Ferris | 307/473 |
| 4,339,675 | 7/1982 | Ramsey | 307/473 |
| 4,400,635 | 8/1983 | Mazgy | 307/458 X |
| 4,498,022 | 2/1985 | Koyama | 307/473 |
| 4,518,876 | 5/1985 | Constantinescu | 307/475 |

*Primary Examiner*—Larry N. Anagnos
*Attorney, Agent, or Firm*—Kenneth Olsen; Carl L. Silverman; Daniel H. Kane, Jr.

[57] ABSTRACT

An improved TTL tristate device with reduced output capacitance incorporates an active discharge sequence of three elements including first and second active transistor elements (Q8, Q7) in an inversion coupling and a third passive element comprising a passive diode cluster (D3, D4, D5) coupled between the base of the second transistor element (Q7) and the enable gate. The passive diode cluster is operatively arranged for delivering base drive current to the base of the second transistor (Q7) when the enable gate (A) is at high potential for operation of the output device in the bistate mode. The passive diode cluster also operatively diverts base drive current away from the base of the second transistor (Q7) when the enable gate (A) is at low potential for operation of the output device in the high impedance third state with reduced output capacitance. The first transistor element (Q8) of the active discharge sequence coupled to the base of the pull-down transistor element (Q4) follows in phase at its collector the potential maintained by the enable gate (A). It actively conducts, discharges and diverts capacitive feedback Miller current from the base of the pull-down transistor element (Q4) when the enable gate is at low potential, and presents a high impedance to current in the direction of the base of the pull-down transistor element (Q4) when the enable gate is at high potential. The power resistors to the active discharge sequence are arranged in a Y network with a capacitive center node.

8 Claims, 3 Drawing Figures

TTL TRISTATE DEVICE WITH REDUCED OUTPUT CAPACITANCE

TECHNICAL FIELD

This invention relates to an improved transistor-transistor logic (TTL) tristate output device or gate which effectively reduces the output capacitance in the high impedance third state. The invention is particularly suitable for integrated circuits and applications in which a plurality of such output gates or devices are coupled to a common bus.

BACKGROUND ART

A prior art transistor logic tristate device with reduced output capacitance described in U.S. Pat. No. 4,311,927 is illustrated in FIG. 1. The tristate output device is provided with an input E for receiving binary data signals $V_i$ of high and low potential and for transmitting output signals $V_o$ to a common bus, not shown, coupled at the output B. For operation in the bistate mode, the output device includes a pull-up transistor element comprising Darlington transistor pair Q2 and Q3 for sourcing current to the output B from high potential $V_{cc}$, a pull-down transistor element Q4 for sinking current from the output B to low potential or ground, and a phase splitter transistor element Q1 coupled at the input E to control the states of the pull-up and pull-down transistor elements in response to data signals $V_i$ at the input. The pull-down transistor element Q4 includes a conventional squaring network at its base comprised of resistor R3 and R4 and transistor Q5.

For the tristate mode of operation an enable gate, not shown, is operatively coupled at A to establish a high impedance third state at the output B of the device when the enable gate is at low potential. For reducing the effective output capacitance during the high impedance third state, an active discharge sequence comprising transistors Q8, Q7, and Q6 is operatively coupled between the base of the pull-down transistor element Q4 and the enable gate at A. The active discharge sequence affords a low impedance route to ground from the base of the pull-down element through transistor Q8 when the enable gate maintains a low potential at A and the output device is in the high impedance third state. As a result, low to high potential transitions on a common bus coupled at the output B of the device will not incidentally drive the pull-down transistor element Q4 to conduction because any capacitive Miller feedback current through the collector to base capacitance of Q4 is rapidly diverted and discharged to ground.

On the other hand the active discharge sequence affords a high impedance to current flow in the opposite direction toward the base of the pull-down transistor element Q4 when the enable gate maintains a high potential at A for operation of the output device in the bistate mode. Thus, during the bistate mode of operation the active discharge sequence blocks current flow from any high potential current source coupled to the enable gate.

The active discharge sequence as described in U.S. Pat. No. 4,311,927 comprises a sequence of three active elements, Q8, Q7, and Q6, in a double inversion series coupling between the enable gate at A and the base of pull-down transistor element Q4. The collector potential of Q6 follows in phase with the enable gate potential maintained at A, the collector potential of Q7 is out of phase with the enable gate potential and the collector potential of Q8 again follows in phase the enable gate potential at A. As a result, when the enable gate is at low potential and the output device is in the high impedance third state, the collector of active discharge transistor element Q8 is also at low potential because Q8 is conducting providing a route to ground from the base of pull-down transistor Q4 for diverting capacitive feedback Miller current to ground. The large capacitance that would otherwise effectively be seen at the output is therefore eliminated. When the enable gate maintains high potential at A, the collector of Q8 is also at high potential because Q8 is nonconducting presenting a high impedance to current flow in the direction of the base of the pull-down transistor element.

The active discharge sequence of three active transistor elements, Q8, Q7, and Q6, coupled between the enable gate at A and the base of transistor Q4 is abstracted from the overall output device and shown as a subcircuit in FIG. 2. The base drive for transistor Q6 and the collector current for transistor Q7 are derived from the potential source $V_{cc}$ through the separate base resistor R6 and collector resistor R7 respectively.

Further description of the transistor logic tristate device with reduced output capacitance illustrated in FIGS. 1 and 2 and the function of particular components is further developed in the U.S. Pat. No. 4,311,927 referred to above.

OBJECTS OF THE INVENTION

It is an object of the present invention to provide an improved TTL tristate device having an active discharge sequence for effectively reducing output capacitance in the high impedance third state incorporating passive elements for reducing the number of active discharge transistor elements in the sequence.

Another object of the invention is to provide an active discharge sequence with higher breakdown voltage by substituting a passive diode cluster for one of the active discharge transistor elements. A feature and advantage of the substitute diode cluster is that it also improves the operative functioning of the remaining transistor element of the active discharge sequence.

A further object of the invention is to provide an active discharge sequence incorporating a resistor network configuration coupling the active discharge sequence to a potential source and having a capacitive node in the resistor network for significantly lower power and higher speed operation and for filtering or decoupling disturbances from the potential source. A feature and advantage of the resistor network configuration of the invention is that it reduces the integrated circuit area necessary for the power supply resistance and the cost of fabrication while the capacitive node is incorporated during wafer fabrication.

DISCLOSURE OF THE INVENTION

In order to accomplish these results the present invention provides an improved TTL tristate device with reduced output capacitance having an active discharge sequence of three elements including first and second active transistor elements (Q8, Q7) in an inversion coupling and a third passive element comprising a passive diode cluster (D3, D4, D5) coupled between the base of the second transistor element (Q7) and the enable gate. The passive diode cluster is operatively arranged for delivering base drive current to the base of the second transistor (Q7) when the enable gate (A) is at high potential for operation of the output device in the bistate mode. The passive diode cluster also operatively diverts base drive current away from the base of the second transistor (Q7) when the enable gate (A) is at low potential for operation of the output device in the high impedance third state with reduced output capacitance. The first transistor element (Q8) of the active discharge sequence coupled to the base of the pull-down transistor element (Q4) follows in phase at its collector the potential maintained by the enable gate (A). It actively conducts, discharges and diverts capacitive feedback Miller current from the base of the pull-down transistor element (Q4) when the enable gate is at low potential, and presents a high impedance to current in the direction of the base of the pull-down transistor element (Q4) when the enable gate is at high potential.

According to the preferred embodiment, the passive diode cluster comprises first, second and third diodes (D3, D4, D5) coupled at three nodes (1, 2, 3) in a delta configuration. The first and second diodes (D3, D4) are oriented in opposite directions on either side of a first node (1) for conducting current in the directions away from the first node, while the second and third diodes (D4, D5) are oriented on either side of a second node (2) for conducting current in the same direction. The second node is coupled at the base of the second transistor (Q7) of the active discharge sequence and the third node (3) is coupled at the enable gate (A).

The invention also provides a resistor array comprising a plurality of resistors (R8, R9, R10) connected in a Y network with a center node (C). The first arm of the Y network is connectable to a potential source $V_{cc}$. The second arm of the Y network is connected to the collector of the second transistor (Q7) of the active discharge sequence while the third arm of the Y network is connected to the first node (1) of the diode cluster.

According to the invention, the resistors of the Y network comprise material of one conductivity type in a buried layer of opposite conductivity type so that the resistors are bounded by P-N junction depletion regions which function as decoupling capacitance at the center node where the common ends of the resistors are connected to the buried layer. The center node decoupling capacitance thereby filters and decouples glitches or disturbances from the potential source $V_{cc}$ to which the Y network is connected.

Furthermore, the resistors of the Y network are selected for dividing the voltage from a potential source and thereby providing an effective lower voltage source at the center node. Dividing of the power supply resistors to the active discharge sequence into a Y network further permits reduction of the integrated circuit resistance area by as much as, for example, 25% while still affording the same power supply resistance to the elements of the active discharge sequence. Substitution of a diode cluster for one of the active discharge sequence transistors also increases the breakdown voltage of the sequence by eliminating the emitter to collector latchback voltage susceptibility of the base coupled third transistor element (Q6).

Other objects, features, and advantages will become apparent in the following specification and accompanying claims.

DESCRIPTION OF BEST MODE OF THE INVENTION

Figure 3:
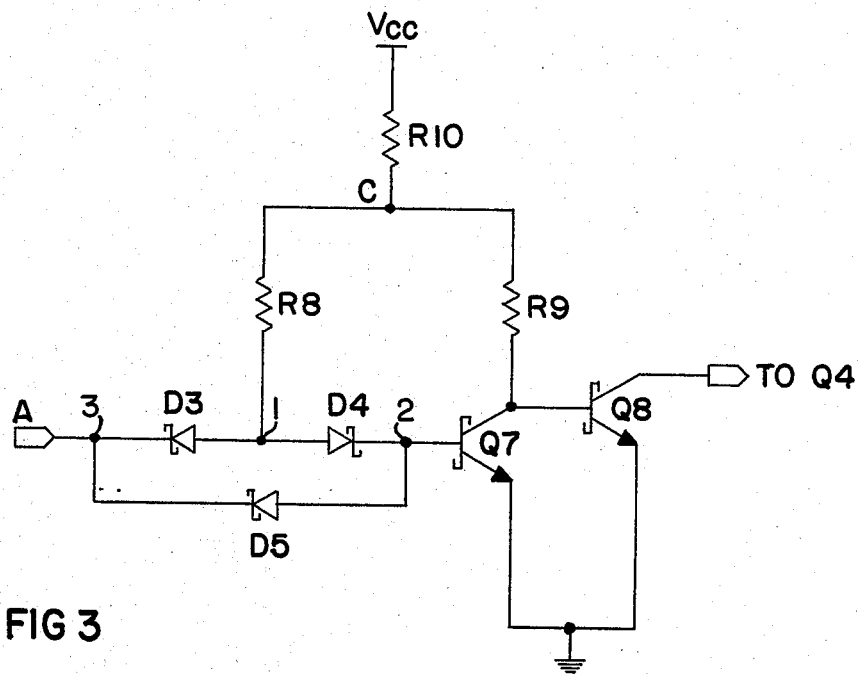
FIG. 3 is a detailed circuit diagram of the improved active discharge sequence according to the present invention for reduced output capacitance of the tristate output device.

Referring to FIG. 3, the present invention provides an active discharge sequence preserving the first and second active discharge sequence transistor elements Q8 and Q7, but substituting for the third active transistor element Q6 the passive diode cluster shown by way of preferred example including diodes D3 and D4 oriented in opposite directions on either side of a first node 1 for conducting current in the directions away from the node 1. Diode D3 is coupled to the enable gate at node 3 while diode D4 is coupled to the base of the second transistor element Q7 at the second node 2. The diode cluster includes a third diode D5 coupled between nodes 2 and 3 to form a diode delta network or configuration with diodes D4 and D5 oriented for conducting current in the same direction on either side of the second node 2.

The function of the third diode D5 is to provide a discharge path for accumulated base charge at transistor Q7 when transistor Q7 is turning off. Thus, capacitive coupling through diode D5 helps significantly in discharging the base of Q7. This diode D5 eliminates the need for a base discharge resistor that would otherwise be required and improves the speed-power characteristics of the circuit. A base discharge resistor would degrade the speed-power characteristics of the circuit by diverting some of the current from potential source $V_{cc}$ that is otherwise available to charge the base of transistor Q7.

Figure 1:
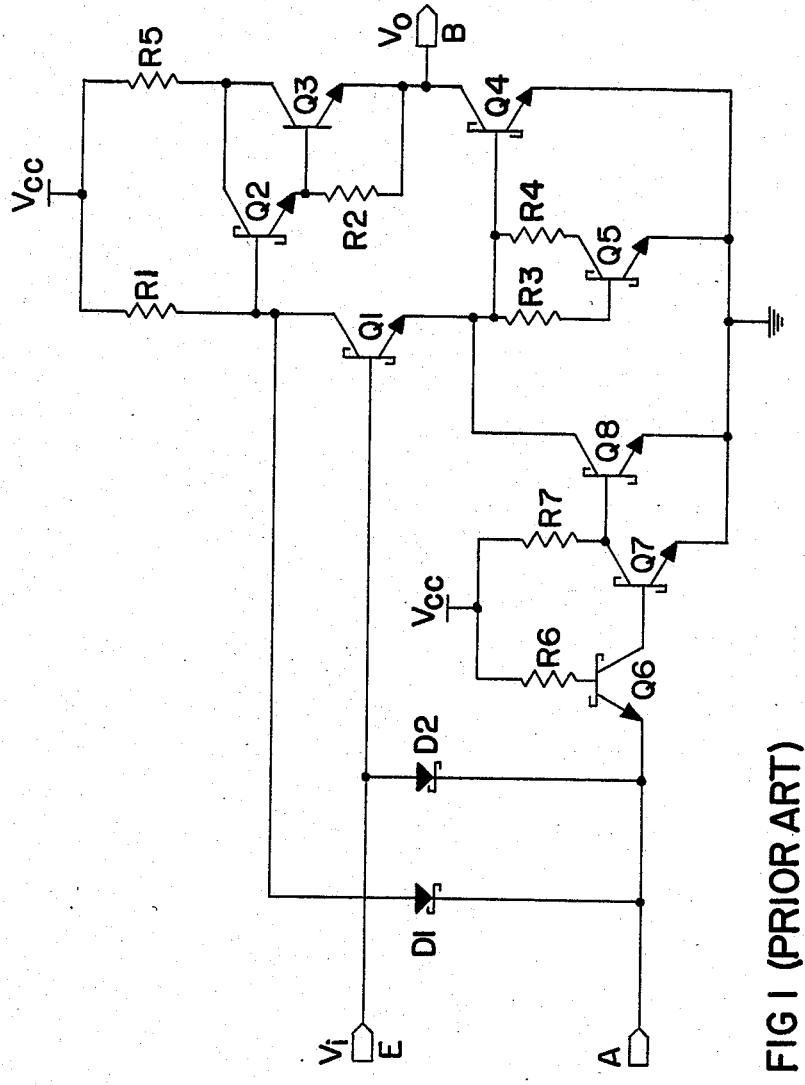
FIG. 1 is a schematic diagram of the prior art transistor logic tristate device with reduced output capacitance described in U.S. Pat. No. 4,311,927.
Figure 2:
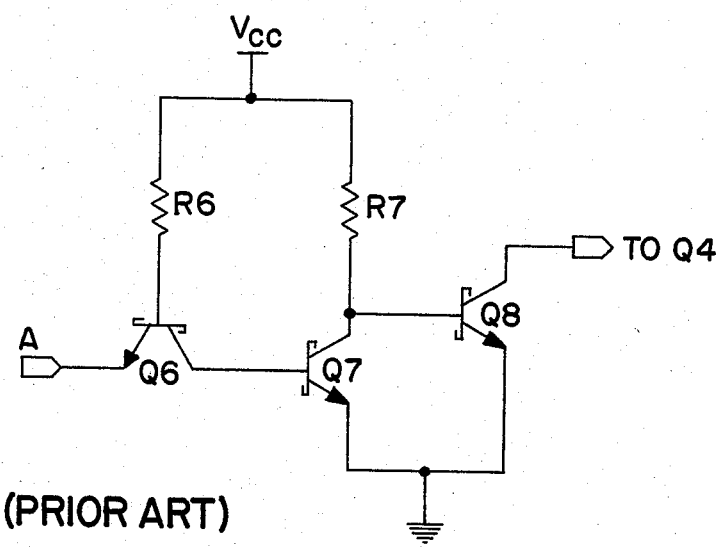
FIG. 2 is a fragmentary detailed schematic diagram of the active discharge sequence from the circuit of FIG. 1 for effectively reducing the output capacitance in the high impedance third state.

Power is delivered to the elements of the active discharge sequence according to the present invention through a Y resistor network consisting of resistors R8, R9, and R10 replacing the two power resistors R6 and R7 shown in the prior art circuits of FIGS. 1 and 2. The resistance values for resistors R8, R9, and R10 are selected to achieve significantly lower power requirements and higher speed than heretofore achieved. Furthermore, the three resistors, R8, R9, and R10, may have a cumulatively smaller value than the resistors R6 and R7 of the prior art circuits shown in FIGS. 1 and 2. Because the Y configuration network delivers the same resistance with lower cumulative values, the three resistors can be configured to consume less surface area of the integrated circuit than can the two resistors R6 and R7 of the prior art circuits thereby reducing the cost of fabrication.

By way of example, resistors R6 and R7 of the prior art circuits of FIGS. 1 and 2 may typically be selected each to have values of 20K ohms. The same effective resistances can be presented for power delivered to the active discharge sequence through the Y network using three resistors, R8, R9, and R10, each having values of 6.7K ohms. Because resistance is proportional to the wafer area, a reduction in fabrication area of as much as 25% can be achieved. The distrubuted Y network circuit is also faster.

Integrated circuit fabrication technology affords another advantage for the resistor network configuration according to the present invention illustrated in FIG. 3. The resistors R8 and R9 may be incorporated as material of one conductivity type in a common buried layer island of opposite conductivity type. The buried layer is connected to the common end of the resistors rather than the positive power supply voltage $V_{cc}$ as in common practice and as shown in FIGS. 1 and 2. As a result, a comparatively large capacitance appears at node C connected between node C and ground. This relatively large capacitance arising from the P-N junction depletion region filters and smoothes out disturbances, variations, or glitches originating from the power supply $V_{cc}$ or other connected circuitry by adding charge at higher voltage and taking it out at lower voltage. This decoupling capacitance effectively results in a more ideal voltage source of lower voltage originating at node C. Furthermore, as heretofore pointed out, the decoupling capacitance can be built in during wafer fabrication by a common coupling of the resistances at a center node in a common buried layer island of the wafer.

The resistance values of R8, R9, and R10 are selected to maintain the voltage at node C substantially constant. Variations in the voltage are smoothed out by the effective capacitance at the center node.

The diodes D3, D4, and D5 as passive elements exhibit high breakdown voltages compared to the active transistor element Q6 which they replace. On the other hand, the base coupled transistor Q6 of the prior art circuits of FIGS. 1 and 2 is susceptible to emitter to collector latchback voltage breakdown with the base open if a signal of sufficient potential $V_i$ appears at the input E. This defect is eliminated by the passive diode cluster substituted according to the present invention.

While the invention has been described with reference to a particular example embodiment of the "Miller killer" active discharge sequence including passive elements, it is intended to cover all modifications and equivalents within the scope of the following claims.

We claim:

1. An improved TTL tristate output device with reduced output capacitance having an output, a bistate mode of operation, pull-up transistor element for sourcing current to the output from high potential, pull-down transistor element for sinking current from the output to low potential, an enable input for establishing a high impedance third state at the output of the device, and an active discharge means coupled between the base of the pull-down transistor element and the enable input, said active discharge means comprising a first transistor operatively coupled to the base of the pull-down transistor element for providing a route to ground when the first transistor is conducting, a second transistor having its collector operatively coupled to the base of the first transistor and its emitter operatively coupled to ground for controlling the conducting state of the first transistor, and third means coupled between the base of the second transistor and the enable input for controlling the conducting state of the second transistor according to the potential at the enable input, the improvement according to which said third means comprises:

passive diode cluster means coupled between the base of the second transistor and the enable input and operatively arranged for delivering base drive current to the base of the second transistor when the enable gate is at high potential for operation of the output device in the bistate mode, said passive diode cluster means being operatively arranged for diverting base drive current away from the base of the second transistor when the enable gate is at low potential for operation of the output device in the high impedance third state with reduced output capacitance;

said passive diode cluster means comprising first, second, and third diodes coupled at three nodes in a delta configuration, said first and second diodes oriented in opposite directions on either side of a first node for conducting current in the directions away from the first node, said second and third diodes oriented on either side of a second node for conducting current in the same direction, one toward and the other away from the second node, said second node being coupled at the base of the second transistor, and said third node being coupled at the enable input;

and a plurality of resistors connected in a Y network with a center node having the first arm of the Y network connectable to a potential source, the second arm of the Y network being connected to the second transistor collector and the third arm of the Y network being connected to the first node of the diode cluster means delta configuration.

2. The improved TTL tristate output device of claim 1 wherein the resistors of the Y network are selected for dividing the voltage from a potential source and for providing an effective lower voltage source at the center node.

3. The improved TTL tristate output device of claim 2 wherein said Y network comprises 3 resistors having substantially equal resistance.

4. An improved TTL tristate output device with reduced output capacitance having an output, a bistate mode of operation, pull-up transistor element for sourcing current to the output from high potential, pull-down transistor element for sinking current from the output to low potential, an enable input for establishing a high impedance third state at the output of the device, and an active discharge means coupled between the base of the pull-down transistor element and the enable input, said active discharge means comprising a first transistor having its collector operatively coupled to the base of the pull-down element for providing a route to ground when the first transistor is conducting, a second transistor having its collector operatively coupled to the base of the first transistor and its emitter operatively coupled to ground for controlling the conducting state of the first transistor and third means coupled between the base of the second transistor and the enable input for controlling the conducting state of the second transistor according to the potential at the enable input, the improvement according to which said third means comprises:

first and second diode means oriented in opposite directions on either side of a node for conducting current in directions away from the node, said first diode means coupled to the enable input, said second diode means coupled to the base of the second transistor and resistor means for operatively coupling between a potential source and said node;

said resistor means comprising a Y network having a center node with one arm of the Y network connectable to a potential source, a second arm of the Y network coupled to the node between the first and second diodes and the third arm of the Y network coupled to the collector of the second transistor.

5. The improved TTL tristate output device of claim 4 further comprising third diode means coupled between the base of the second transistor and the enable input and oriented for conducting current in the direction of the enable input.

6. The improved TTL tristate output device of claim 4 wherein the resistors of the Y network are selected for dividing the voltage from a potential source for providing an effective lower voltage source at the center node.

7. An improved TTL tristate output device with reduced output capacitance having an output, a bistate mode of operation, pull-up transistor element for sourcing current to the output from high potential, pull-down transistor element for sinking current from the output to low potential, an enable input for establishing a high impedance third state at the output of the device when the enable input is at low potential, and an active discharge means coupled between the base of the pull-down transistor element and the enable input, said active discharge means comprising a first transistor having its collector operatively coupled to the base of the pull-down element for providing a route to ground when the first transistor is conducting, a second transistor having its collector operatively coupled to the base of the first transistor and its emitter operatively coupled to ground for controlling the conducting state of the first transistor, and third means coupled between the base of the second transistor and the enable input for controlling the conducting state of the second transistor according to the potential at the enable input potential, said third means constructed and arranged for delivering base drive current to the base of the second transistor when the enable input is at high potential so that the second transistor is conducting and the first transistor is nonconducting for operation of the output device in the bistate mode, said third means constructed and arranged for depriving the base of the second transistor of base drive current when the enable gate is at low potential so that the second transistor is non-conducting and the first transistor is conducting for operation of the device in the high impedance third state with effectively reduced output capacitance, the improvement according to which said third means of the active discharge sequence comprises:

a passive diode cluster in a delta configuration network coupled between the base of the second transistor and the enable input;

and a passive resistor array in a Y configuration network with arms of the Y configuration network being coupled to a node of the delta configuration network and the collector of the second transistor, the third arm of said Y configuration network to be coupled to a potential source.

8. The improved TTL tristate output device of claim 7 wherein the passive diode cluster comprises first, second and third diodes, said first and second diodes oriented in opposite directions on either side of a first node for conducting current in directions away from the first node, and second and third diodes oriented on either side of a second node for conducting current in the same direction, one toward and the other away from the second node, said first diode and third diode being connected to the enable gate at a third node and said second node being connected to the base of the second transistor, said Y configuration network having one arm connected to said first node.

* * * * *